(12) United States Patent
Nakanishi et al.

(10) Patent No.: US 6,603,782 B2
(45) Date of Patent: Aug. 5, 2003

(54) LD/PD MODULE

(75) Inventors: Hiromi Nakanishi, Osaka (JP); Yoshiki Kuhara, Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 110 days.

(21) Appl. No.: 09/987,609

(22) Filed: Nov. 15, 2001

(65) Prior Publication Data

US 2002/0071641 A1 Jun. 13, 2002

(30) Foreign Application Priority Data

Dec. 7, 2000 (JP) ........................................ 2000/372295

(51) Int. Cl.$^7$ .............................................. H01S 5/022
(52) U.S. Cl. .............................. 372/36; 385/49; 385/88
(58) Field of Search ............................. 372/36; 385/14, 385/49, 88

(56) References Cited

U.S. PATENT DOCUMENTS 5,764,826 A * 6/1998 Kuhara et al. ................ 385/24
5,787,215 A * 7/1998 Kuhara et al. ................ 385/88
6,546,171 B2 * 4/2003 Fukutomi ..................... 385/49

OTHER PUBLICATIONS

Proceedings of the 1999 Electronics Society Conference of IEICE, C–3–28, p. 133 and its translation.

Proceedings of the 1999 Electronics Society Conference of IEICE, SC–3–7, p. 352 and its translation.

* cited by examiner

*Primary Examiner*—James Davie
(74) *Attorney, Agent, or Firm*—Smith, Gambrell & Russell, LLP

(57) ABSTRACT

An LD/PD module having a main silicon substrate having a cavity, a transmitting portion having an LD and an LD driving IC which is directly mounted upon the main silicon substrate, and a receiving portion having a PD and an amplifier which is indirectly mounted upon the main silicon substrate via an auxiliary insulating substrate embedded in the cavity. The auxiliary insulating substrate suppresses current-induced crosstalk from the transmitting portion to the receiving portion.

24 Claims, 7 Drawing Sheets

Fig.3 IMAGINARY EXAMPLE
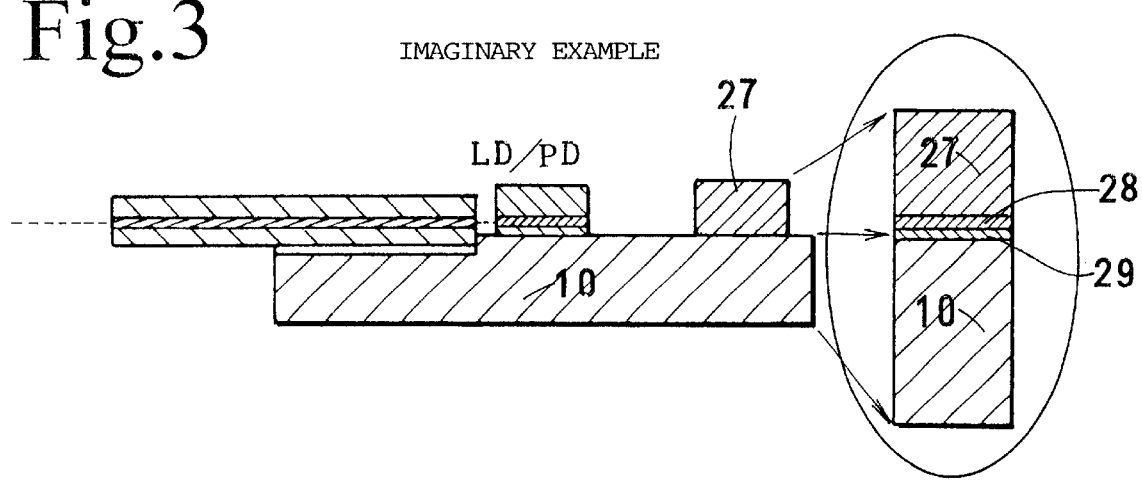
Fig.4 IMAGINARY EXAMPLE
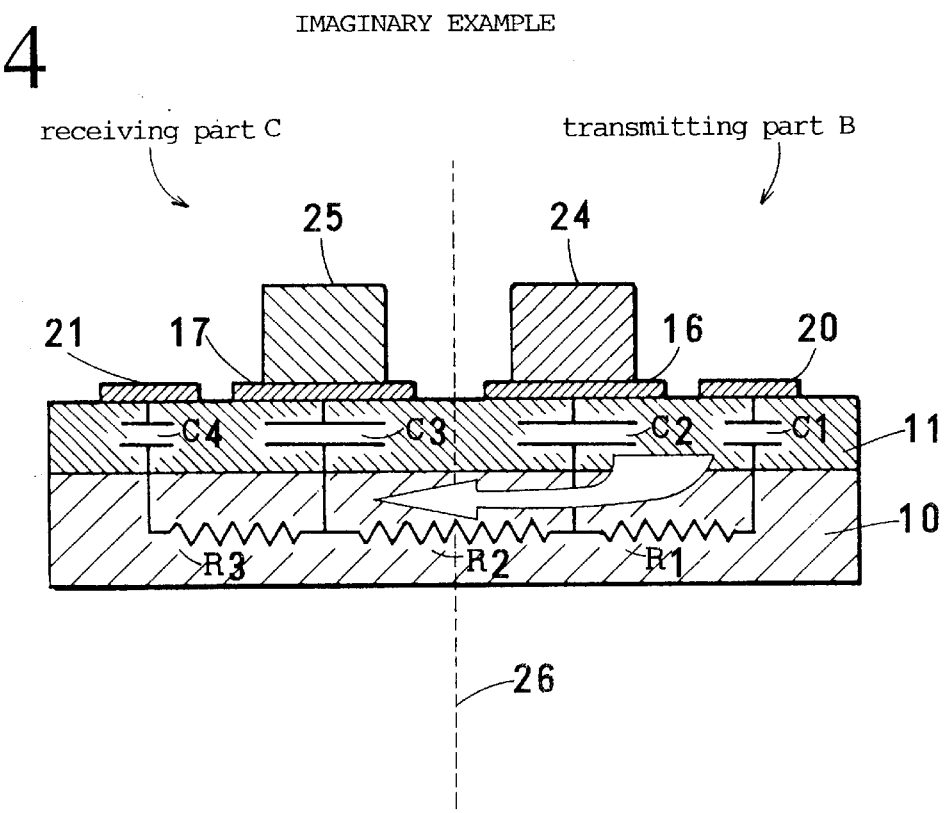

EMBODIMENT 1

EMBODIMENT 1

Fig.9          EMBODIMENT 2
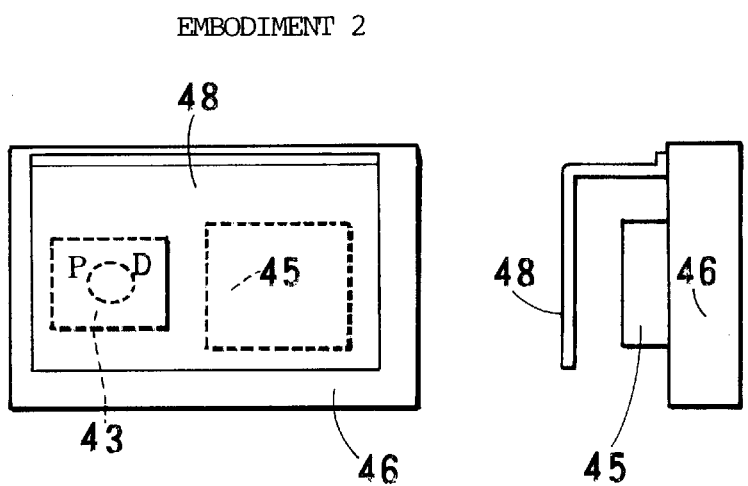
Fig.10
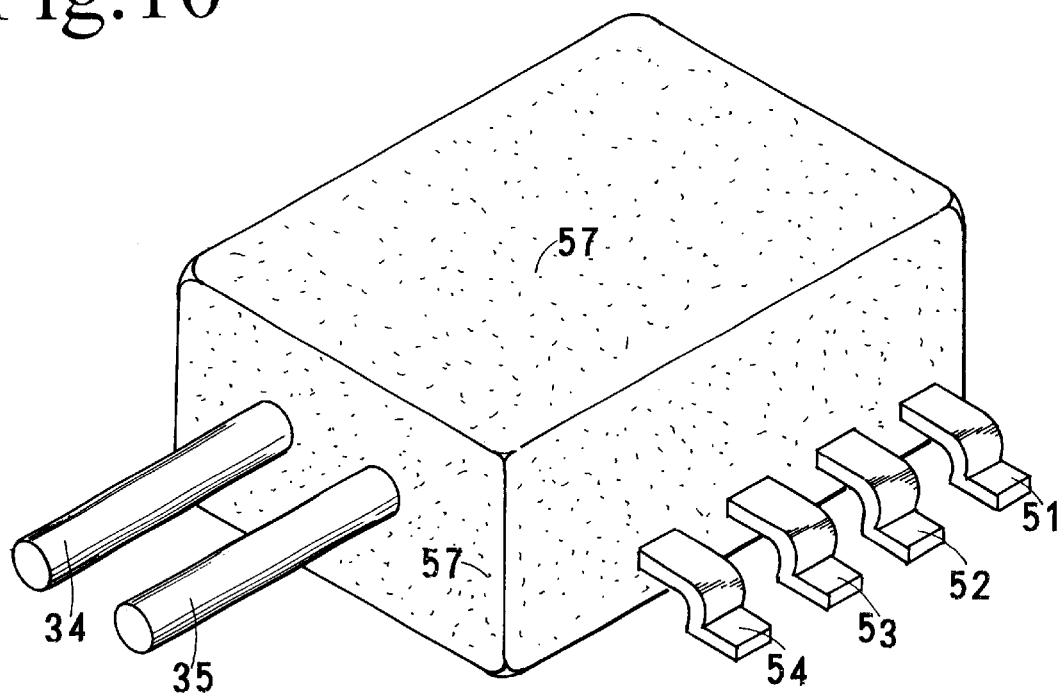

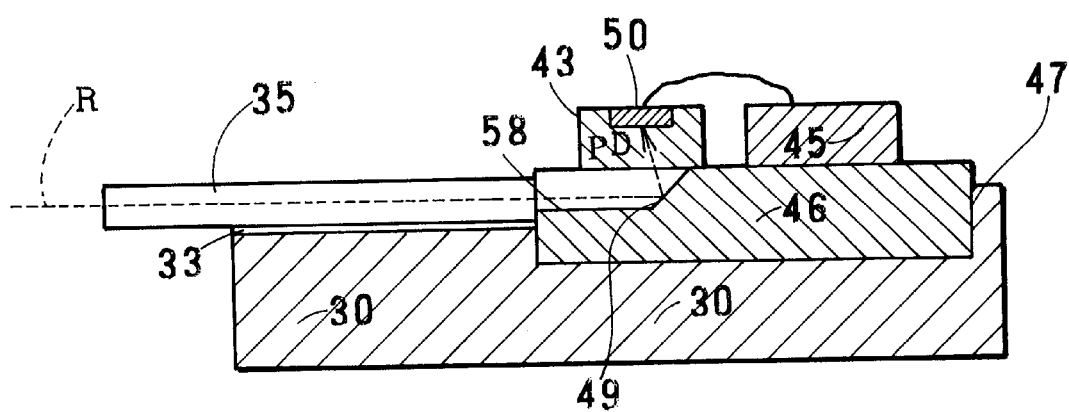
Fig.12  EMBODIMENT 4

LD/PD MODULE

BACKGROUND OF THE INVENTION

1. Field of the Invention

This invention relates to an LD/PD module for optical communications, in particular, aims at proposing a low-cost, small sized LD/PD module. Sometimes a term "optical communication device" is used for signifying an LD/PD module, an LD module and a PD module collectively in this description. LD/PD modules having both a transmitting (LD) part and a receiving (PD) part are suffering from the problem of the invasion of electric and optical signals of the transmitting portion into the receiving portion. The phenomenon of the flow of electrical/optical signals from the LD to the PD is called "crosstalk". The signals generated by the LD are noise for the PD portion. The crosstalk should be excluded from the PD portion.

This application claims the priority of Japanese Patent Application No.2000-372295 filed on Dec. 7, 2000 which is incorporated herein by reference.

The crosstalk includes electrical crosstalk and optical crosstalk. Size-reduction of LD/PD modules enhances the crosstalk by bringing the PD closer to the LD. Miniaturization of LD/PD modules requires exclusion of the electrical/optical crosstalk. The purpose of the present invention is to propose low-cost, compact optical communication modules by suppressing the optical/electrical crosstalk.

2. Description of Related Art

FIG. 1 shows one of the most prevalent LD/PD modules. A laser diode (LD) as a light source is stored in a cylindrical, metallic package. A photodiode (PD) is also stored in another cylindrical, metallic package. The LD module 1 and the PD module 2 are connected via optical fibers 3 and 4 with a central station (not shown in the figures). Pins 9 and 9 fix the LD module 1 and the PD module 2 to a print circuit board 5 and connect the LD 1 and the PD 2 to some of the wiring patterns on the board 5. The print circuit board 5 maintains a transmitting circuit 6 and a receiving circuit 7.

A metallic shield plate 8 stands at a boundary between the transmitting circuit 6 and the receiving circuit 7 for suppressing electric crosstalk from the transmitting circuit 6 to the receiving circuit 7. The metallic shield plate 8 which is grounded (connected to the earth level on the circuit board) absorbs electromagnetic noise. The metallic packages prohibit light of the LD 1 from leaking and forbid the PD 2 from receiving the LD light. The LD/PD device of FIG. 1 succeeds in lowering electrical/optical crosstalk between the LD and the PD.

The LD/PD device having a discrete structure of FIG. 1 has drawbacks of forbidding further size/cost-reduction. The metal-packaged LD module 1 and the metal-packaged PD module 2 are large and expensive. The print circuit board 5 for mounting the transmitting circuit 6 and the receiving circuit 7 is wide. The discrete LD/PD module of FIG. 1 has attained to the limit of reducing the size and alleviating the cost. Still further size/cost reduction of LD/PD modules is indispensable for the prevalence of the optical communications systems.

A promising candidate is a planar type module preparing a silicon bench having V-grooves and an insulating overcoat, producing metallized wiring patterns on the silicon bench, mounting PD/LD chips on the patterns and fitting optical fibers into the V-grooves for facing the front ends to the PD and the LD. The planar type module is proposed by, e.g., ① R. Takahashi, K. Murakami, Y Sunaga, T. Tokoro, M. Kobayashi, "Packaging of optical semiconductor chips for SFF optical transceiver", PROCEEDINGS OF THE 1999 ELECTRONICS SOCIETY CONFERENCE OF IEICE, C-3-28, p133 (1999).

FIG. 2 shows the plan view of the module proposed by ①. A $SiO_2$ insulating layer 11 is made upon a rear portion of a flat silicon substrate 10. Two parallel V-grooves 12 and 13 are formed upon a front portion of the silicon substrate. A transmitting fiber 14 and receiving fiber 15 are fitted into the V-grooves 12 and 13 on the substrate. Metallized patterns 16, 18 and 19 are printed upon the insulating layer 11 of the substrate 10. An LD chip 22 is mounted upon the pattern 18. A PD chip 23 is mounted upon the pattern 19. A monitoring PD 70 is fitted upon the pattern 16 behind the LD 22.

The LD makes transmitting light signals S which are in proportion to the driving current. The LD chip emits the light signals from both the front end and the rear end. The forward transmitting light signals S propagate in the transmitting fiber 14 to the central station. The rear light is detected by the PD 70 which always monitors the average power of the LD. The receiving light signals R which have been generated in the central station propagate in the receiving fiber 15 and go into the PD 23. The PD 23 makes photocurrent which is in proportion to the receiving light signals. An upper half above a dotted line 26 is a transmitting portion (B) and a lower half below the dotted line 26 is a receiving portion (C). Both the portions B and C are built upon the common silicon substrate 11 which is far smaller than the print circuit board 5 of FIG. 1.

The planar type module has advantages over the discrete one of FIG. 1. The V-grooves 12 and 13, the PD/LD mounting patterns 18 and 19 and the monitoring PD mounting pattern 16 can be made on the silicon bench 10 at a stroke. The fibers 14 and 15, the LD and the PD can be exactly positioned by the grooves or marks without positive alignment, which is called "passive alignment". Unification of the tiny silicon bench allows the module to reduce the size and the cost. The size/cost-reduction will raise an industrial value of the tiny on-silicon planar module.

The planar module mounting electronic devices, optoelectronic devices and fibers in two dimensions on the bench are an excellent and promising technique. The use of the silicon single crystal substrate enables device makers to employ the well-matured silicon photolithography technics. The photolithography can either form the V-grooves with a narrow spacing on the silicon substrate and position PDs and LDs at the determined spots with preciseness.

On the contrary, the PD module and the LD module of FIG. 1 require active alignment of searching the optimum spots of the PD and the LD by supplying current to the LD, guiding the LD light via the fiber to the PD, measuring the power, displacing the LD and maximizing the output power. The active alignment which should determined the optimum spots for the LD with a ±1 μm tolerance and for the PD with a ±5 μm tolerance requires much time and high cost.

The planar type module shown by FIG. 2 which mounts the fibers and the device chips on the silicon bench dispenses with the time-consuming, costly active alignment. The module determines the positions of the optoelectronic devices (LDs, PDs) by referring to the marks printed on the Si bench (substrate) and the positions of the fibers by the grooves. The mounting mode without the alignment step is called "passive alignment". The planar type module has a possibility of alleviating the cost by eliminating the time-consuming alignment.

The passive alignment enables the planar type modules to position optoelectronic devices (LDs, PDs) and electronic devices (AMPs) to the optimum spots with sufficient coupling efficiency by referring to the marks printed on the silicon substrate without lightening the LDs and detecting the light by the PDs. The planar type communications modules are promising technology which will accomplish high precision mounting without active alignment.

Another advantage of the planar type modules is the grooves formed on the silicon substrates for mounting optical fibers. In the case of the LD/PD modules which exchange signals with e.g., the central station via two parallel optical fibers, formation of V-grooves which has the spacing equal to the standardized fiber spacing will enhance the productivity and cut the cost down. Despite the promising prospects, the planar type optical communication modules have not been put into practice yet. They still stay at the experimental steps. Several causes deprive the proposed planar modules of the reality. This invention takes up the crosstalk among the causes.

The discrete type LD/PD module of FIG. 1 electrically shields the receiving portion C with the metallic packaged PD from the transmitting portion B with the metallic packaged LD by the middle metallic shield plate 8. There is a long distance between the LD and the PD. Triplet metallic shields and the long distance perfectly suppress the crosstalk from the transmitting part B to the receiving part C.

The planar unified type LD/PD module of FIG. 2 has neither metallic shield plate on the middle dotted line 26 nor metallic packages storing the LD and the PD. The silicon substrate allots a poor distance to the LD and the PD. The use of double fibers alleviates the optical crosstalk. But the non-metallic shield and the short distance incur large electric crosstalk in the planar type of FIG. 2. Electric crosstalk degrades the performance of the LD/PD module by impeding the PD from receiving correct signals (R) propagating in the fiber 15.

When the optical communications device contains a pair of a receiving part and a transmitting part or a plurality of receiving parts, the crosstalk causes a serious problem on the receiving parts. The crosstalk is an inherent problem, in particular, in LD/PD modules which contain both the transmitting parts and the receiving parts. The transmitting portion generates strong pulse current signals with a high repetition rate of a low impedance for injecting the current into the LD. The receiving portion has a high input impedance for receiving weak signals with high sensitivity. The strong signal currents leak from the transmitting portion to the high impedance-receiving portion as noise, which is the electric crosstalk.

It is believed by the ordinary skilled that the electrical crosstalk should be annihilated by building a metallic plate between the transmitting portion (B) and the receiving portion (C) and by connecting the metallic plate to the ground (earth level) of the wiring pattern. If noise with a high pulse repetition rate makes a direct flight as electromagnetic waves from the transmitting portion (B) to the receiving portion (C), the tall metallic plate would effectively absorb the electromagnetic noise and protect the receiving portion (C) from the noise. Such a contrivance is suggested by, ② Sonomi Ishii, Takehiko Nomura, Atsushi Izawa, Masayuki Iwase, "Crosstalk analysis of MT-RJ optical Sub Assembly", PROCEEDINGS OF THE 2000 ELECTRONICS SOCIETY CONFERENCE OF IEICE, SC-3-7, p352 (2000).

The optical sub-assembly proposed by ② contains a silicon bench (substrate), a PD and an LD mounted on the silicon substrate, fibers facing the PD and the LD, and a metallic plate standing between the PD and the LD for shielding the PD from the LD. The assembly lacks an amplifier and a driving IC. The metallic plate is connected to the ground (earth) of a metallized wiring pattern on the silicon bench. The metallic plate absorbs the electromagnetic noise from the transmitting part.

The electrostatic shield is a stereotype solution for protecting a circuit from external electromagnetic noise.

The transmitting portion of the sub-assembly ② contains only the LD but lacks the driving IC which will inject a large current to the LD and will make strong electromagnetic noise. Thus, the noise made by the transmitting portion is weak. The metallic plate standing in the middle of the circuit would be sufficient to annihilate the weak noise.

If the transmitting part also included a driving IC for supplying the injection current to the LD or other strong noise (current or electromagnetic waves) generators, the crosstalk would be more serious and more critical than ②. The brusque metallic plate would be insufficient for excluding the crosstalk.

Print circuit boards (made from e.g., insulating epoxy resin) have been the most popular boards for printing copper wiring patterns and mounting electric devices. The grounded metallic shield has been a common technique for suppressing noise on the epoxy circuit boards, as shown in FIG. 1. The inventors of the present invention were aware of a new problem originated from the displacement of the print circuit board on a silicon substrate. The silicon crystal is an excellent material for the substrate of electric circuits, because photolithography can make microscopic structures on the single crystal silicon substrate. The skilled may deem silicon substrates as an equivalence of the traditional epoxy print circuit boards. But it is not true. Silicon crystal is not an equivalence to the epoxy circuit boards as a substrate.

The $SiO_2$/Si substrate which is employed in the planar type modules of FIG. 2 has an inherent problem. The epoxy print circuit board is an insulator. But silicon is not an insulator but a semiconductor. Then, an insulating layer, for example, silicon dioxide ($SiO_2$) is formed upon the silicon substrate for mounting electric devices and printing wiring patterns. The conductive silicon is coated with the insulating $SiO_2$. The surface of the silicon substrate is insulating. Thus, the skilled deem the $SiO_2$/Si substrate as a superior brother of the plastic (epoxy) circuit boards. The overcoating insulating layer ($SiO_2$, SiN and so on) is very thin. The thin insulator can cut DC current but cannot cut high frequency AC current. The $SiO_2$/Si substrate conveys AC current by acting as capacitors and a conductor unlike the traditional plastic circuit boards. The inventors found the problem inherent to silicon for the first time. Nobody is aware of the problem yet.

Imaginary Example

An imaginary example would be helpful to clarify the electrical crosstalk between the transmitting portion and the receiving portion. The imaginary example would be assumed to have a receiving portion including a PD and an amplifier and a transmitting portion including an LD and an LD-driving IC. The imaginary module does not belong to prior art. No actual prior module contains the PD-AMP receiving part and the LD-IC transmitting part. The present invention has a two step advantage from the state of art. Then, it is not easy to understand the problems which confronted the inventors of the present invention. The imaginary example is a virtual LD/PD module intervening between the present invention and the nearest prior art. The virtual module has the following defects.

FIG. 3 shows an inherent problem of a silicon substrate. In the figure, a silicon substrate 10 has a fiber, an optoelectronic device (PD or LD) and an electrical device chip 27 behind the optoelectronic device. The electrical device 27 is either a driving IC for an LD module or an amplifier IC for a PD module. An enlarged section of the electrical device 27 is shown at a righthand margin of FIG. 3. An insulating film 29 and an electrode pad 28 are formed upon the silicon substrate 10. The electrical device 27 is fitted upon the electrode pad 28.

The silicon substrate 10 is an n-type or a p-type semiconductor which has low resistivity and allows electric current to flow well. The thin insulating film 29 prohibits DC electric current from flowing. However, high frequency AD current can jump over the insulating film 29 via an electrostatic capacitance. Optical communications employ high frequency (repetition rate) pulse signals. Such high frequency signals can pass through the thin insulating film 29. The high frequency transmitting signals travel in the silicon substrate, pass the thin insulating film by the electrostatic capacitance, reach the receiving part and induce noise (substrate-propagating crosstalk). This is the above-mentioned silicon inherent problem. The conductive silicon causes the problem. Print circuit boards made from the epoxy resin are entirely free from the substrate-conductive crosstalk owing to the high resistivity.

Since silicon is not an insulator but a semiconductor, the assembly of the capacitor having the $SiO_2$ film and the conductive silicon substrate allows the noise current of the transmitting part to propagate to the receiving part. The driving IC yields strong pulse signals. The signals pass the insulating film and the silicon substrate and arrive at the amplifier, which causes the electric crosstalk. Conventionally, electrical crosstalk is believed to be induced by electromagnetic waves. The inventors of the present invention were aware of the current-induced crosstalk which is caused by the current flowing in the silicon substrate.

FIG. 4 shows a mode of crosstalk propagation in an LD/PD module due to electric current again. The crosstalk is a serious problem which has not been pointed out yet. A thin insulating film 11 coats a silicon substrate 10. A middle dotted line 26 is a boundary. The right side is a transmitting portion B. The transmitting portion B has metallized patterns 16 and 20 and a driving IC 24 on the metallized pattern 16. The insulating film 11 makes capacitors C1 and C2 between the silicon substrate 10 and the patterns 16 and 20. The left side of the boundary line 26 is a light receiving portion C. The receiving portion C has metallized patterns 17 and 21 and an amplifier 25 on the metallized pattern 17. The insulating film 11 makes capacitors C3 and C4 between the silicon substrate 10 and the patterns 17 and 21.

The silicon substrate has some conductivity which admits electric current. In the silicon substrate, effective resistors R1, R2 and R3 are formed among the capacitors C1, C2, C3 and C4. The transmitting portion B is joined to the receiving portion C by the capacitors and the effective resistors. The transmitting signals have high frequency (high repetition rates). The impedance of the capacitors $1/j \omega C$ is very small. The strong signal of the driving IC propagates via the capacitors and the resistors to the amplifier 25. The leak of the driving IC signal to the amplifier induces electric crosstalk. Namely, in addition to electromagnetic waves, the silicon substrate itself carries noise from the driving IC 24 on the transmitting portion B to the amplifier 25 on the receiving portion C. The inventors of the present invention found the electric crosstalk conveyed by the silicon substrate in PLC modules for the first time. The prior art ② may be effective for alleviating the spatial crosstalk carried by electromagnetic waves. But ② is incompetent to reduce the electric crosstalk propagating in the silicon substrate.

In practice, the silicon substrates which are employed in the PLC LD/PD modules have innegligible conductivity which increases the cross talk by allowing the receiving portion to couple with the transmitting portion electrically. The inventors insist that attention should be paid to the current coupling between the transmitting and receiving portions in the PLC type modules. Recent miniaturization of modules narrows the distance of fibers in the double fiber transmitting/receiving modules which utilize two fibers for bidirectional communications. Narrower fiber distance enhances the electrical (current) crosstalk stronger.

In FIG. 4, the driving IC 24 is very close to the amplifier (AMP) IC 25. Miniaturization of modules shortens the fiber distance and the IC distance more. The faster the transmitting speed of signals is, the stronger electromagnetic waves the driving IC emits. The high signal speed reduces the capacitor impedance $1/j \omega C$. These conditions cooperate to enhance the crosstalk. The transmitting speed of the prevalent systems is now 156 Mbps. The transmitting speed will rise via 622 Mbps up to 1.25 Gbps or 2.5 Gbps in near future. The high speed transmission will induce serious current coupled electrical crosstalk.

The fiber distance is another significant factor raising the crosstalk between the PD part and the LD part. Current prevailing networks have a wide core-core distance between the transmitting (sending) fiber (S) and the receiving fiber (R) of 6.25 mm, which is 50 times as large as a fiber diameter (125 $\mu$m). Some networks, however, try to shorten the fiber distance down to 4.5 mm (36 times of fiber diameter) or less than 1 mm. Extremely narrow distances of 0.75 mm (6 times of fiber diameter) or 0.25 mm (twice of fiber diameter) are also proposed as the fiber core-core distance. The shortening of the fiber distance forces optoelectronic devices to approach nearer and nearer, which raises the crosstalk.

As described hitherto, the crosstalk between the transmitting portion and the receiving portion includes optical crosstalk and electrical crosstalk. The electrical crosstalk seems to have been confused with electromagnetic crosstalk. However, the electrical crosstalk also includes current-induced crosstalk which is caused by the current flow in the silicon substrate and the induction current via the substantial capacitors built by thin insulating films on the silicon substrate. One purpose of the present invention is to provide a PLC type LD/PD module capable of curbing the current induced crosstalk. Another purpose of the present invention is to provide an inexpensive, small-sized LD/PD module by suppressing the crosstalk between the LD part and the PD part or among a plurality of PD parts.

SUMMARY OF THE INVENTION

An LD/PD module of the present invention includes a main silicon substrate with a cavity and a plateau side by side, an insulating auxiliary substrate embedded in the cavity of the main substrate, a transmitting part mounted upon the plateau of the main silicon substrate, a receiving part mounted on the auxiliary insulating substrate. Namely, the transmitting part is directly sustained by the silicon main substrate but the receiving part is indirectly sustained via the auxiliary insulation substrate (submount). The transmitting part includes at least an LD chip. The transmitting part optionally includes an LD driving IC. The receiving part includes at least a PD chip and optionally includes an amplifier for amplifying the photocurrent of the PD. The main silicon substrate has a light guiding medium coupled to the LD of the transmitting part and another light guiding medium coupled to the PD of the receiving part. The gist of the present invention is the asymmetry of mounting the transmitting part directly to the silicon substrate for heightening the coupling efficiency and mounting the receiving part on the insulating substrate for suppressing the current-induced crosstalk.

The planar lightguide circuit (PLC) type modules making use of single crystal silicon substrates have been contrived for eliminating the alignment process which consumes much time and labor. Silicon is a unique material accompanied by matured photolithography and highly precise finishing technology. The photolithography can make any fine, complex structures, for example, holes, hills, grooves or cavities on single crystal silicon substrates.

The silicon substrate allows us to mount an LD and a PD at the optimum spots by marking on the substrate and to fit fibers at exact position by inserting them into V-grooves. This is an advantage of the silicon single crystal substrate. The LD/fiber junction requires accuracy of an order of 1 μm. Thus, the alignment of the LD/fiber should be assigned to the silicon substrate.

However, the receiving portion admits wider tolerance than the transmitting portion. The rigorous alignment is unnecessary to the PD/fiber junction. Thus, the present invention tries to mount the receiving part on the insulating submount.

Insulating substrates are inferior to silicon in positioning parts, since anisotropic etching is impossible. However, the PD/fiber joint requires not so rigorous alignment, because the PD has a wide sensitive region. The required tolerance for the receiving part is far wider than the tolerance for the transmitting part. Thus, this invention mounts the receiving part on the insulating substrate, relying upon the moderate tolerance of the PD/fiber junction.

Investigating the planar lightguide circuits, the Inventors of the present invention noticed that the rigorous tolerance for the LD/fiber junction should be intact but the tolerance of the PD/fiber joint can be alleviated since the PD has a wide sensitive region. Thus, the PD/fiber junction should not be necessarily mounted on the silicon single crystal substrate. The present invention has originated from the change of the common sense of the PD/fiber junction.

FIG. 8 shows the principle of cutting the current flow by the insulating substrate on which this invention is based. The right half is a transmitting portion which is directly mounted upon a silicon single crystal substrate 30. An LD driving IC 44 is coupled in AC mode via the capacitance of an insulating film 36 to the silicon substrate 30. The left half is a receiving part which is mounted upon an insulating auxiliary substrate 46.

The current flowing in the silicon substrate 30 is stopped by the insulating thick substrate 46. The LD current cannot arrive at the receiving part. The insulating submount 46 forbids a current-induced crosstalk.

BRIEF DESCRIPTION OF THE DRAWINGS

FIG. 3 is a longitudinally, vertical section of an imaginary example (not prior art) of an LD/PD module produced by bonding an LD and a PD on metallized patterns printed on a silicon substrate for clarifying the probability of electric current flowing between devices via thin insulating films as capacitors and the conductive silicon substrate.

FIG. 4 is a laterally, vertical section of an imaginary example (not prior art) of an LD/PD module produced by bonding an LD and a PD on metallized patterns printed on a silicon substrate for clarifying the probability of strong electric signal current flowing from an LD driving IC to a high impedance AMP-IC via thin insulating films as capacitors and the conductive silicon substrate.

FIG. 9 is a plan view and side view of an insulating auxiliary substrate of an LD/PD module of Embodiment 2 further containing a metallic shield plate covering the PD and an AMP on a receiving part.

FIG. 10 is a perspective view of a completed LD/PD module produced by fixing a silicon substrate having fibers, metallized patterns, a transmitting part, an insulating auxiliary substrate and a receiving part on a central part of a leadframe, wirebonding leadpins with patterns on the silicon substrate, and molding the substrate and the leadframe with epoxy resin.

FIG. 12 is a longitudinally sectioned view of Embodiment 4 containing optical fibers as light media and a bottom incidence type PD fitted upon an insulating auxiliary substrate embedded in a shallow hole perforated on a main silicon substrate.

DETAILED DESCRIPTION OF THE PREFERRED EMBODIMENTS

Figure 1:
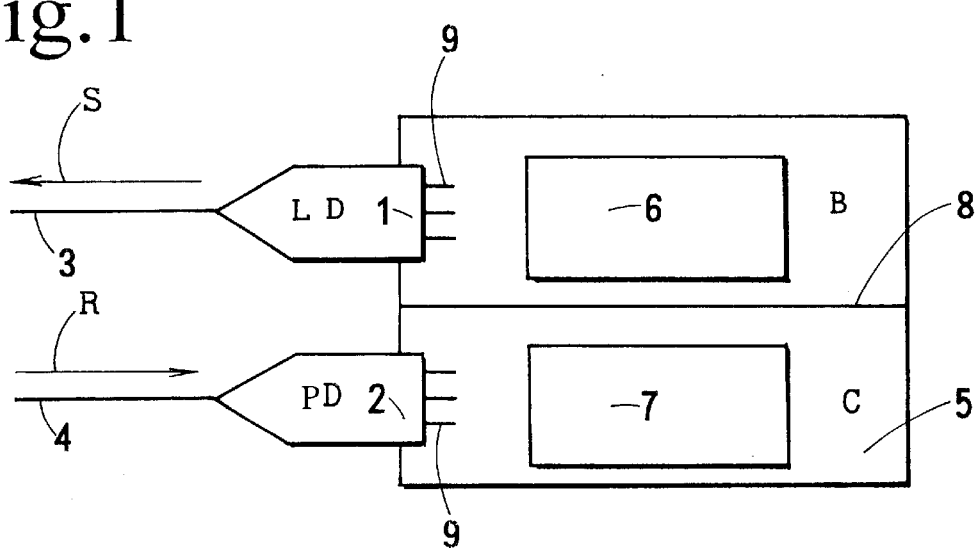
FIG. 1 is a plan view of one of the prevalent-LD/PD modules consisting of an LD module containing an LD, a PD module having a PD chip, an electric circuit of a transmitting part on a print circuit board, another electric circuit of a receiving part on another print circuit board and a partition wall.
Figure 2:
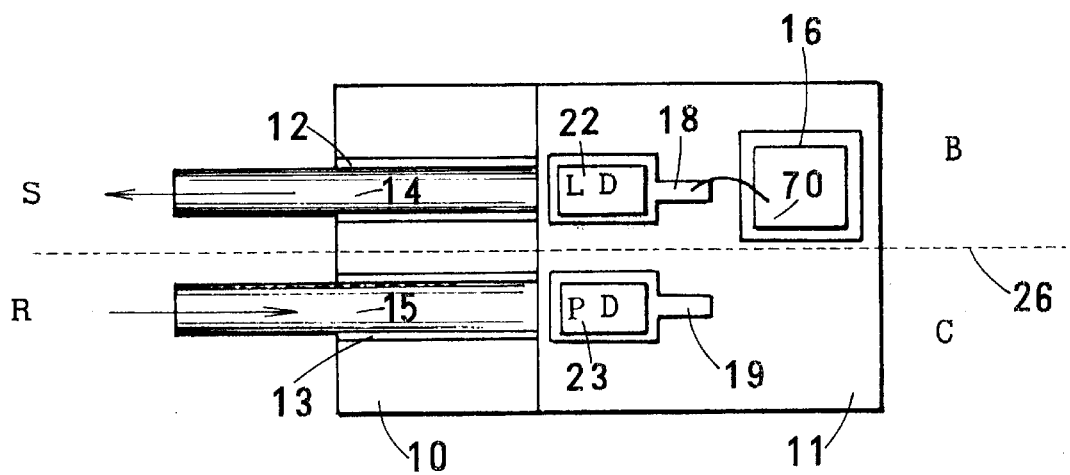
FIG. 2 is a schematic plan view of an LD/PD module proposed by ① R. Takahashi, K. Murakami, Y. Sunaga, T. Tokoro, M. Kobayashi, "Packaging of optical semiconductor chips for SFF optical transceiver", PROCEEDINGS OF THE 1999 ELECTRONICS SOCIETY CONFERENCE OF IEICE, C-3-28, p133 (1999).

Planar lightguide circuits (PLC) are built upon silicon single crystal substrates. The present invention employs a single crystal silicon substrate as a main substrate for making optoelectronic modules. The (100) surface Si single crystal enables us to make V-grooves having side walls consisting of (±1±1±1) planes with high precision. The high accuracy of the V-grooves is indispensable for an exact alignment of fibers with optoelectronic devices (LDs, PDs, LEDs, and APDs). The silicon substrate has light guiding media on a front half The silicon substrate has a cavity at one side and a plateau at another side of a rear half The plateau is allocated for direct mounting of the transmitting part. The cavity is made for indirect mounting of the PD part. This invention needs to bore the shallow cavity on a silicon substrate. Anisotropic etching enables us to bore many cavities on a large wafer at a stroke easily at the wafer process. The cavities can also be bored by mechanical tools.

An auxiliary substrate (submount) is a flat insulating plate for supporting a receiving portion containing a PD, optionally and an amplifier IC. The auxiliary insulating submount is inserted into the cavity of the main silicon substrate. Ceramics and liquid crystal polymers are suitable materials for the auxiliary insulating submount.

A transmitting part contains an LD and an LD driving IC. The LD driving IC is a strong origin of noise, because the driving IC produces large pulsation currents. The LD driving IC produces serious crosstalk from the transmitting part to the receiving part. The pulsation current of the LD driving IC brings about big noise to the PD. The transmitting part sometimes includes a monitoring photodiode (PD) for monitoring the output power of the LD. This invention can be applied to any type of transmitting parts.

The receiving part includes the photodiode (PD) and an amplifier (AMP). A waveguide type photodiode and a skewed wall type photodiode allow light to enter via a front end of the PD chip. The front end incidence type PDs require no change of the light path, because the light emanating from a fiber can go directly into the PD via the front end without changing the light path. A bottom incidence type PD and a top incidence type PD are also available. The use of the bottom incidence type PD requires building V-grooves or reflecting walls for guiding the light emanating from the fiber to the bottom of the PD. The use of the top incidence type PD requires another submount for supporting the top incidence PD in a vertical posture.

A PD having an InGaAs light receiving layer and an Inp substrate is suitable for the PD of the receiving part. The InGaAs-PD has sensitivity for the signal light having wavelengths of 1.3 μm band and 1.55 μm band. Instead of the InGaAs-PD, a Si-photodiode or a GaAs-photodiode can be the PD in the receiving portion of the module of the present invention. The PD portion with high impedance is subject to external noise in addition to the noise from the LD part. Shielding of the PD part with a metallic plate joined to the ground pattern is more effective for suppressing the noise.

Unlike the transmitting part, the receiving part (PD and AMP) is mounted upon the insulating auxiliary substrate (submount). The PD-loaded auxiliary submount is inserted and fixed in the cavity of the silicon main substrate. The silicon substrate allows electric current to flow. But the insulating auxiliary submount forbids current to flow. The insulating submount can annihilate the current-induced crosstalk. An insulating substrate of a thickness more than 100 μm reduces the electrostatic capacitance between overcoating patterns and the underlying silicon substrate. The insulating submount gives a large value to the impedance 1/j ω C of the effective capacitors. The large impedance has an effect of decreasing the current-induced crosstalk.

EMBODIMENT 1

Optical Fiber Type; Front End Incidence Type PD; FIGS. 5,6,7 and 10

Figure 5:
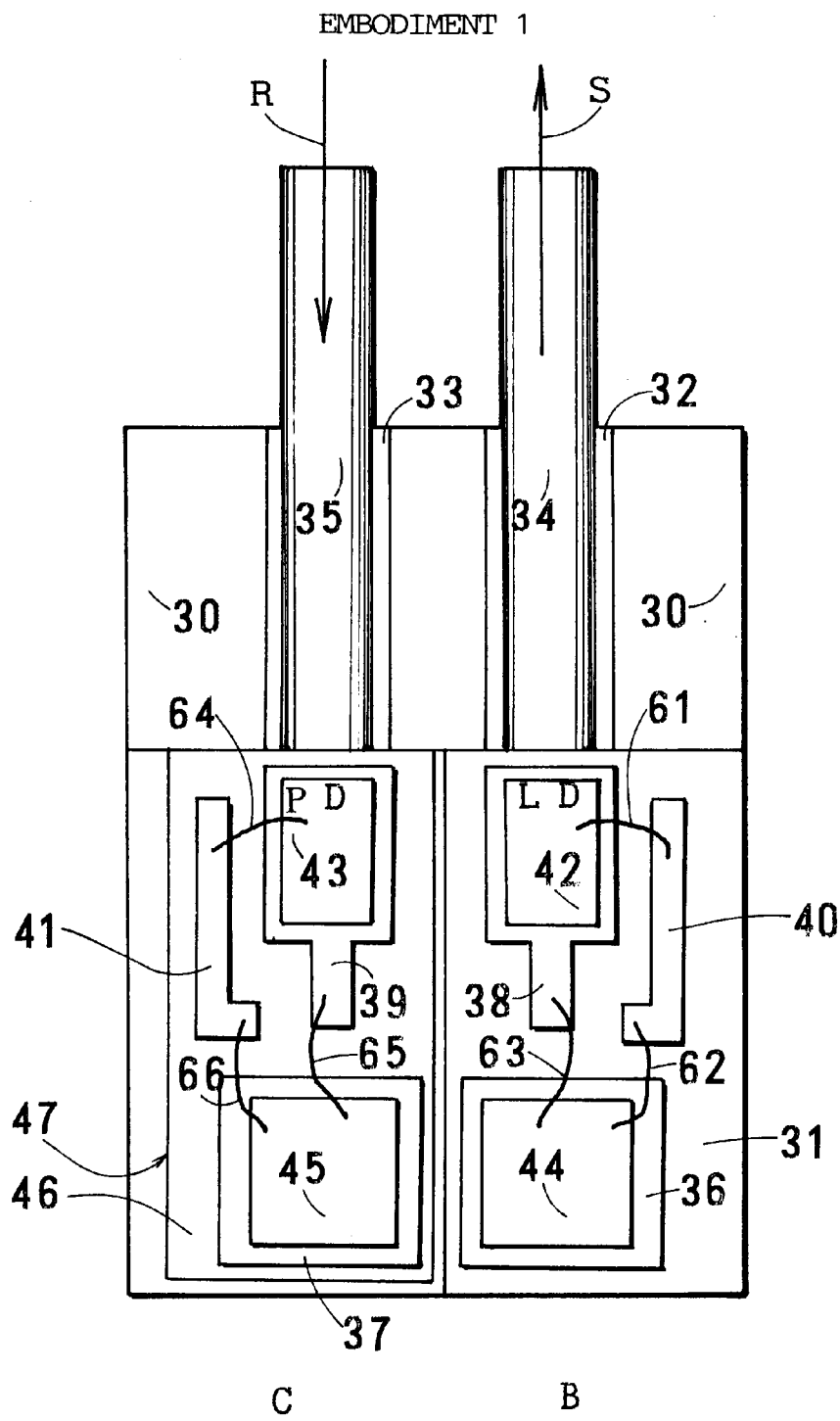
FIG. 5 is a plan view of Embodiment 1 of the present invention containing optical fibers as light media and a front end incidence type PD fitted upon an insulating auxiliary substrate embedded in a shallow hole perforated on a main silicon substrate.
Figure 6:
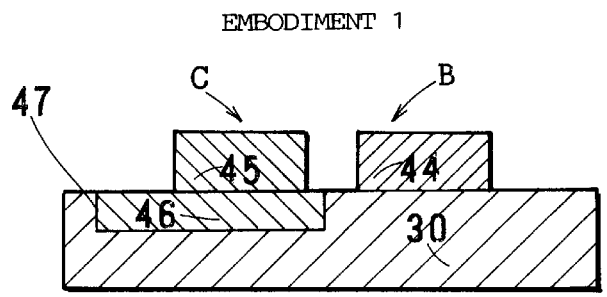
FIG. 6 is a laterally sectioned view of Embodiment 1 taken along a line connecting an AMP-IC and an LD driving IC for showing the AMP-IC being insulated from the LD driving IC by an insulating auxiliary substrate.

FIG. 5 and FIG. 6 show Embodiment 1. FIG. 5 is a plan view. FIG. 6 is a sectional view. The main substrate is a rectangular silicon substrate 30. The main silicon substrate 30 has a shallow rectangular hole 47 perforated on one side of the rear half of the main substrate 30. An insulating rectangular auxiliary substrate 46 is buried in the shallow hole 47. An SiO$_2$ insulation film 31 is formed upon the other side of the rear half of the main substrate 30. FIG. 5 shows an example having a receiving part C on the left and a transmitting part B on the right. A reverse disposition is also allowable.

The insulating SiO$_2$ film 31 is not necessarily restricted within the rear half of the main silicon substrate 30. The insulation film is requisite for the rear right half but is optional for the front half of the main substrate 30.

The SiO$_2$ insulating film 31 can be made by sputtering, oxidization or CVD on the silicon substrate 30. Instead of SiO$_2$, other insulator, e.g., silicon nitride SiN is also available for the insulation film 31. Two parallel V-grooves 32 and 33 are formed on the front half on the silicon main substrate 30 by, for example, anisotropic etching. A transmitting (sending) fiber 34 and a receiving fiber 35 are fixed in the V-grooves 32 and 33 respectively.

Conductive patterns 36, 38 and 40 are printed upon the insulation film 31 on the right side of the rear half of the Si substrate 30. An LD chip 42 is bonded upon the forward pattern 38. An LD driving IC 44 is bonded upon the backward pattern 36. The patterns 40, 38, the LD and the LD driving IC 44 are connected by wires 61, 62 and 63.

Conductive patterns 37, 39 and 41 are formed upon the insulating auxiliary substrate 46 on the left side of the rear half of the silicon main substrate 30. A PD chip 43 is bonded upon the forward pattern 39. An AMP(amplifier) chip 45 is bonded upon the backward pattern 37. Wires 64, 65 and 66 connect the PD 43, the pattern 41 and the AMP 45. The preliminary bonding steps should be conveniently done on the insulating substrate 46 before being attached to the main substrate 30. The chip-bonded and wire-bonded auxiliary substrate 46 should be embedded in the hole 47 of the substrate 30.

Figure 7:
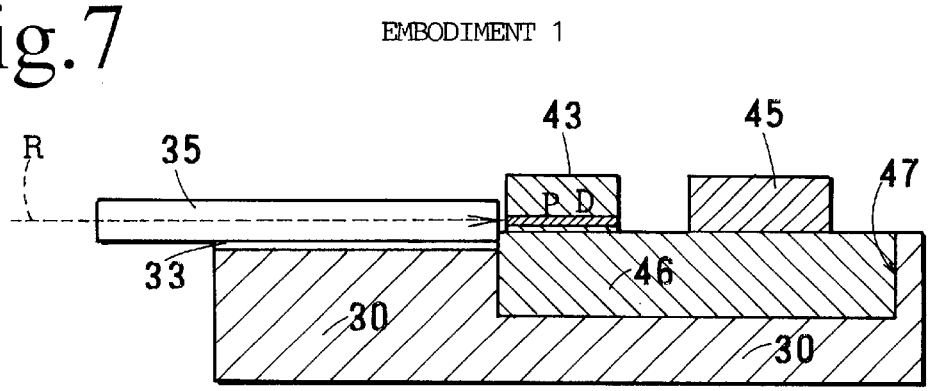
FIG. 7 is a longitudinally sectioned view of Embodiment 1 taken along a line connecting a fiber, a PD and an AMP-IC on an insulating auxiliary substrate for showing the PD and the AMP-IC being insulated from an LD driving IC by an insulating auxiliary substrate.
Figure 8:
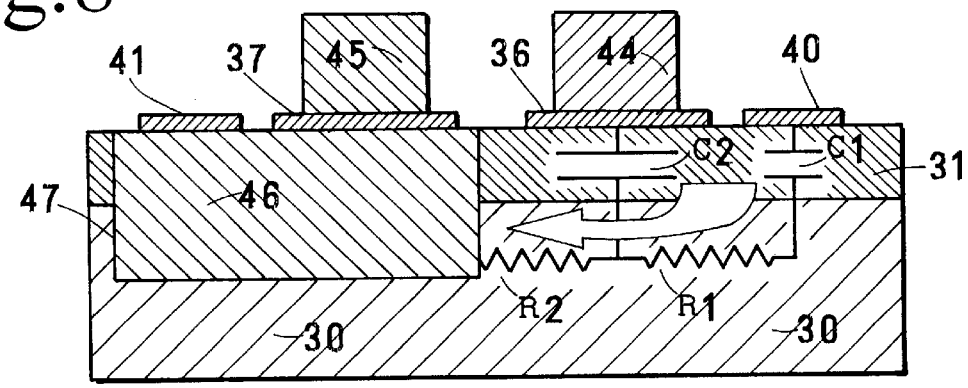
FIG. 8 is a sectional view of an LD/PD module of the present invention containing a transmitting part (LD part) mounted upon a main silicon substrate and a receiving part (PD part) fitted upon an insulating auxiliary substrate embedded in a shallow hole perforated on the main silicon substrate for showing the auxiliary insulation substrate shielding the current from the LD or an LD driving IC via the insulation thin film as a capacitor and the conductive main silicon substrate.

FIG. 6 shows the AMP 45 fitted on the auxiliary substrate 46 and the driving IC 44 fitted on the main substrate 30. FIG. 7 is a section taken along a central line of the receiving portion C. FIG. 7 shows that the PD 43 and the AMP-IC 45 are fitted upon the insulating auxiliary substrate 46. The PD 43 is not a bottom incidence type but a front end incidence type. The PD 43 is bonded upside down on the pattern of the insulating auxiliary substrate 46 for harmonizing the light sensing layer of the PD with the core of the optical fiber 35. The front end incidence of the PD 43 allows such a linear alignment.

FIG. 7 and FIG. 6 clarify the double substrate structure of Embodiment 1. Then, the main silicon substrate 30 is glued to a center plate of a leadframe which is a thin metal plate punched into the central plate and many leadpins. The metallized patterns on the substrate are joined to the leadpins by wirebonding. The substrate with the leadframe is molded with epoxy resin in a die. A resin-molded module with projecting the fibers and the leadpins is completed.

Embodiment 1 is fabricated by the following steps. A silicon wafer is prepared. The chip size of a single crystal silicon substrate is determined to be a 5 mm width, a 10 mm length and 1.5 mm thickness. The silicon substrates are made by producing the $SiO_2$ insulating film 31 on the silicon wafer, forming the fiber-supporting V-grooves 32 and 33 by anisotropic etching on the silicon wafer per chip, and making the cavities by mechanical drilling, ultrasonic process or RIE (Reactive Ion Etching) for containing an insulating substrate. The cavity size is a 2 mm width, a 4 mm length and a 0.5 mm depth.

Further, the wiring pattern 40 and Au-metallized patterns 38, 36 as bases for the LD 42 and the LD driving IC 44 are made by printing, sputtering/etching or CVD/etching. Then, the silicon wafers are diced into chips of a size of 5 mm×10 mm. The LD 42 and the LD driving IC 44 will be mounted directly on the silicon substrate.

Auxiliary insulation substrates (submount) 46 are made from liquid crystal polymers or ceramics. Large-sized insulating plates 46 should be prepared like the case of the silicon wafer. Wafer processes make electrode patterns 39, 37 and a wiring pattern 41 per chip upon the insulating plate. The large insulating plate is sliced into individual auxiliary insulating submount chips 46. The chip size is 2 mm×4 mm×0.5 mm which coincides with the size of the cavity.

The front end incidence type pin-PD (500 $\mu$m×500 $\mu$m×200 $\mu$m) 43 containing an InP substrate and an InGaAs light receiving layer is bonded upon the pattern 39 of the auxiliary substrate chip 46. The Si amplifier (AMP) IC 45 is bonded upon the pattern 37. The PD 43, the AMP 45 and the pattern 41 are wire-bonded with Au wires 64, 65 and 66. The auxiliary substrate has been completed. The auxiliary submount 46 is inserted in the cavity 47 of the main silicon substrate 30 and glued to the cavity with an adhesive.

The two fibers 34 and 35 of a $\phi$ 10 $\mu$m core and a $\phi$125 $\mu$m cladding are stuck into the parallel V-grooves 32 and 33 by an epoxy resin adhesive with a core-core distance of 1.75 mm.

The LD 42, the PD 43, the fiber 34, 35 and the gaps between the fibers and the LD/PD are coated with a transparent silicone type resin which has a refractive index akin to the fibers. The transparency is required for the resin in order to allow the light exchange via the gaps between the fibers and the LD/PD. The reason why the resin having a similar refractive index to the fibers is chosen is that similarity of refractive indices reduces the reflection loss or the refraction loss at the boundaries of the media. Here, the silicone resin (soft fluid at presetting) containing extra "e" should not be confused with silicon (solid semiconductor). The silicone type resins are set by UV light or heat. The silicone resins are soft even at postsetting. The softness of the resin gently protects the devices and the wires from external forces.

The completed silicon bench 30 is fixed upon a base metal (central portion) of a leadframe which is a thin metal plate having the central base metal, an outer rectangle frame and a plurality of leadpins projecting inward from the frame. The leadpins are wirebonded to the corresponding wiring patterns on the substrates 30 and 46. The substrate 30 and the leadframe are molded in a metallic die with an epoxy resin 57 which is an opaque resin superior in adhesion. An epoxy resin packaged module is completed as shown in FIG. 10. The two fibers 34 and 35 project from the front end of the epoxy resin 57. A plurality of lead pins 51 to 54 protrudes from the sides of the package.

EMBODIMENT 2

Fiber Type; Front End Incidence PD; Shield; FIGS. 5, 6, 9 and 10

Embodiment 2 reinforces the separation of the receiving portion from the LD portion by a metallic shield. The production of Embodiment 2 is same till the intermediate steps as shown in FIGS. 5 and 6 as Embodiment 1. At the step, the transmitting portion B includes a fiber 34, an LD 42, an LD driving IC aligning along a straight line on a main silicon substrate and the receiving portion C contains another fiber 35, a PD 43 and an AMP 45 along another direct line on an auxiliary submount 46.

Embodiment 2 allocates the metallic shield 48 to the receiving portion C for covering the PD 43 and the AMP 45, as shown in FIG. 9. The metallic shield is a Γ shaped thin metal plate with a foot glued to the ground of the auxiliary submount 46 at a periphery closer to the LD portion B. The side and the top of the metallic shield 48 protect the PD 43 and the AMP 45 from electromagnetic noise from the transmitting portion B. The opaque metallic shield 48 separates the PD 43 from optical noise emitted from the LD 42.

The metallic shield 48 is effective for curbing both the optical crosstalk and the electromagnetic crosstalk. A decline of the electromagnetic and optical noise enhances the sensitivity of the PD part of Embodiment 2. The metallic shield with the top and the side is cantilevered via one foot to the auxiliary submount 46 in the figure. Another metallic shield having a top, two sides and two feet is more favorable. A topless shield with a side and a foot is also available.

The material of the metallic shield plate 48 is copper(Cu), iron (Fe), a Fe—Ni—Co alloy (Kovar; trademark) or brass. Here, a brass-made metallic shield 48 is fitted with a conductive paste on a ground metallized pattern of the auxiliary substrate 46.

A LD/PD module of Embodiment 2 is constructed by fixing the LD/PD loaded silicon substrate 30 on a base metal of a leadframe, wirebonding the leadpins with the patterns, supplying a transparent resin to gaps between the fibers and the PD/LD, molding the substrate and the leadframe with an epoxy resin. The final shape of Embodiment 2 is also shown in FIG. 10.

The maximum sensible frequency was 156 Mbps for the prior LD/PD module which builds both the PD portion and the LD portion upon the common silicon substrate. On the contrary, Embodiment 1 and Embodiment 2 of the present invention display excellent performance capable of transmitting/receiving high repetition rate signals of 622 Mbps to 2.5 Gbps.

EMBODIMENT 3

Figure 11:
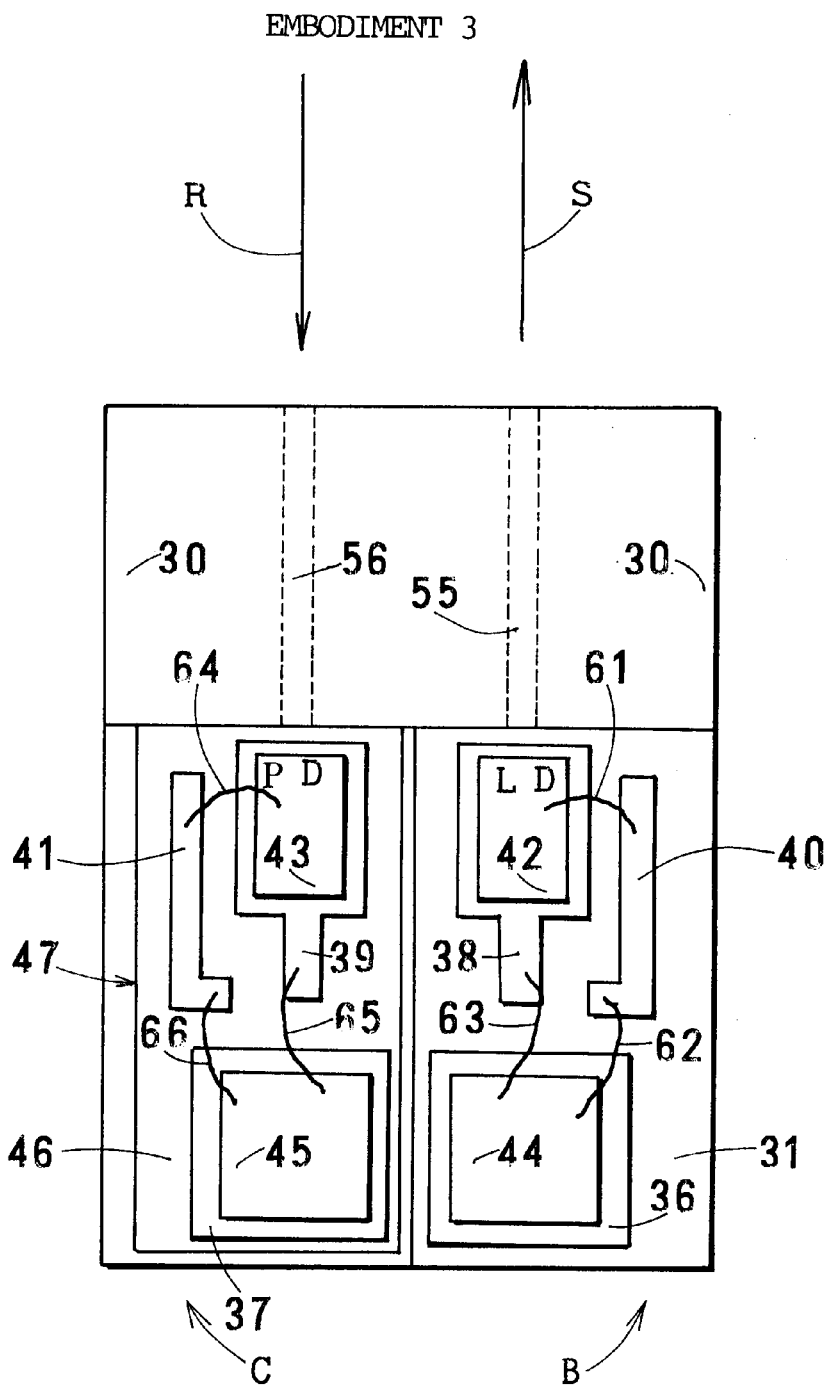
FIG. 11 is a plan view of Embodiment 3 containing optical waveguides as light media and a front end incidence type PD fitted upon an insulating auxiliary substrate embedded in a shallow hole perforated on a main silicon substrate.

Waveguide Type; Front End Incidence PD; FIGS. 11 and 10

Embodiments 1 and 2 employ optical fibers as media for guiding light signals to the LD/PD module. Embodiment 3 replaces the optical fibers by light waveguides made on a silicon substrate as media for leading light signals. The waveguides on the silicon substrate are joined to outer optical fibers by an optical contact. FIG. 11 shows a plan view of Embodiment 3.

The main substrate is a rectangular silicon substrate 30. A shallow cavity is bored on a left half of a rear portion of the silicon substrate 30. A right half of a rear portion is a plateau coated with $SiO_2$ insulating layer 31. The forward half of the silicon bench has neither V-groove nor fiber. Instead, optical waveguides 55 and 56 are formed on the forward half of the silicon bench. The waveguide has a triple layer structure containing an undercladding layer, a core and an overcladding layer. The triple layer structure is fabricated by piling an $SiO_2$ undercladding layer on the silicon substrate, piling a Ge-doped $SiO_2$ core layer with a higher refractive index, etching selectively the Ge-doped SiO$_2$ away except two lines allocated for guiding light, and piling further a SiO$_2$ undercladding layer. Two resultant cores make waveguides 55 and 56.

The rear portion is slightly etched for harmonizing the height of the LD emission part and the PD sensing part with the cores of the light waveguides. Other components than the waveguides are the same as Embodiment 1. The receiving portion contains a PD chip 43 and an AMP chip 45 bonded along an extension of the light waveguide 56 on an auxiliary insulating substrate 46. The transmitting portion B includes an LD chip 42 and LD driving IC chip 44 bonded along an extension of the light waveguide 55 on the main silicon substrate 30.

At the step, a metallic shield plate 48 can be optionally fitted to the PD part for covering the PD 43 and the AMP 45 like Embodiment 2. Embodiment 3 is fabricated further by potting a transparent resin on the LD, the PD and the gaps between the waveguides and the LD/PD, fitting the silicon substrate 30 upon a base metal of a leadframe, wirebonding the patterns with corresponding leadpins, sticking two fibers to the front ends of the waveguides 55 and 56, molding the silicon main substrate 30 and the leadframe with a epoxy resin. The completed module of Embodiment 3 is the same as the module shown by FIG. 10.

EMBODIMENT 4

Fiber Type; Bottom Incidence PD; FIGS. 12 and 10

Embodiments 1 to 3 employ the front end incidence type PDs. The front end incidence type PD includes a waveguide type PD and a skewed end type PD. The front end incidence type PD has an advantage of simplifying the structure of PD modules by allowing the PD chip to lie along an extension of a waveguide or an optical fiber. The LD/PD modules based upon the front incidence type PD is enough workable, so long as the user does not demand extreme high sensitivity.

The front end incidence type PD has drawbacks of narrow tolerance of mounting and high cost of fabrication.

A bottom incidence type PD is one of the most prevalent PDs. Wide effective aperture, high sensitivity, wide tolerance and high yield are advantages of the bottom incidence PDs. Embodiment 4 makes use of a bottom incidence type PD. FIG. 12 is a longitudinally sectioned view taken along a line cutting the PD portion of Embodiment 4.

A silicon substrate 30 has a shallow cavity 47 on the left side and a plateau on the right side of the rear half. An insulating substrate 46 having a PD portion is imbedded into the cavity 47. An SiO$_2$ insulating film 31 is formed upon the plateau of the right rear half. Two parallel V-grooves 32 and 33 are perforated on the front half of the silicon substrate 30 for supporting a transmitting fiber 34 and a receiving fiber 35.

Metallized patterns 36,38 and 40 are made upon the insulating film 31 on the right rear half of the substrate 30. An LD 42 is mounted upon the front pattern 38. An LD driving IC chip 44 is bonded upon the rear pattern 36. Wires 61, 62 and 63 connect the LD 42, the IC 44 and the pattern 40. The above structure is similar to former embodiments.

Embodiment 4 differs from the precedents in the structure of the auxiliary insulating substrate 46 embosomed in the cavity 47. The bottom incidence PD does not take in light via the ends but via the bottom. The use of the bottom incidence type PD inhibits the PD part from taking a straight light path. A guiding groove 58 is formed at the front part of the insulating substrate 46 for changing the light path. The section of the guiding groove 58 can be a triangle, a rectangle or a half circle. The guiding groove 58 has a slanting mirror 49 at the rear end. The PD 43 is bonded epi-side up over the V-groove 58 on the insulating auxiliary substrate 46. Behind the PD 43, an amplifier (AMP) IC 45 is bonded upon the same insulating substrate 46. A wire joins the PD 43 to the AMP 45. The receiving light emanating from the optical fiber 35 passes the guiding groove 58, shoots the mirror 49, changes the path by the reflection, goes via the bottom into the PD 43, arrives at a sensing layer 50 and makes photocurrent. The photocurrent is amplified by the AMP 45.

The bottom incidence PD forces the receiving portion to raise the height of the PD higher than an extension of the fiber core. The receiving portion C is lifted higher than the transmitting portion B. The necessity of the path-conversion compels the module to take an asymmetric shape of a higher PD portion and a lower LD portion. If the substrate were a single member, the asymmetry would require a difficult problem of grinding partially a left half part of the substrate. The present invention can easily solve the problem of the excess height by allotting an excess thickness to the auxiliary insulating substrate. Since the auxiliary substrate is independent from the main substrate, the adjustment of the heights induces no problem. The use of the binary substrates of the present invention is convenient for the bottom incidence PD. A thicker insulating substrate is favorable for curbing the electric crosstalk since the enhancement of the receiving portion increased the distance between the PD and the LD. Embodiment 4 succeeded in receiving/transmitting high frequency signals of 622 Mbps to 2.5 Gbps.

The embodiments contain both the LD driving IC and the amplifier IC. If an LD/PD module lacks one or both of the LD driving IC and the AMP-IC, the PD portion and the LD portion contain wiring patterns which cause current-induced crosstalk from the LD part to the PD portion. Thus, the present invention is also effective to the LD/PD modules which lack one or both of the LD driving IC and the AMP-IC.

We claim:

1. An LD/PD module comprising:
    a main silicon substrate having a plateau and a cavity side by side;
    an auxiliary insulating substrate embedded in the cavity of the main silicon substrate;
    a transmitting portion including a laser diode (LD) and being mounted upon the plateau of the main silicon substrate;
    a receiving portion including a photodiode (PD) and being mounted upon the auxiliary insulating substrate;
    a transmitting light guide medium formed on the silicon substrate for guiding light signals from the LD to an external fiber; and
    a receiving light guide medium formed on the silicon substrate for guiding light signals from another external fiber to the PD.

2. The LD/PD module according to claim 1, wherein the transmitting portion includes an LD driving IC.

3. The LD/PD module according to claim 1, wherein the receiving portion includes an amplifier (AMP).

4. The LD/PD module according to claim 1, wherein the transmitting portion includes an LD driving IC and the receiving portion includes an amplifier (AMP).

5. The LD/PD module according to claim 1, wherein the transmitting light guide medium and the receiving light guide medium are optical fibers.

6. The LD/PD module according to claim 2, wherein the transmitting light guide medium and the receiving light guide medium are optical fibers.

7. The LD/PD module according to claim 3, wherein the transmitting light guide medium and the receiving light guide medium are optical fibers.

8. The LD/PD module according to claim 4, wherein the transmitting light guide medium and the receiving light guide medium are optical fibers.

9. The LD/PD module according to claim 1, wherein the transmitting light guide medium and the receiving light guide medium are light waveguides.

10. The LD/PD module according to claim 2, wherein the transmitting light guide medium and the receiving light guide medium are light waveguides.

11. The LD/PD module according to claim 3, wherein the transmitting light guide medium and the receiving light guide medium are light waveguides.

12. The LD/PD module according to claim 4, wherein the transmitting light guide medium and the receiving light guide medium are light waveguides.

13. The LD/PD module according to claim 1, wherein the receiving portion is covered with a metallic shield plate.

14. The LD/PD module according to claim 2, wherein the receiving portion is covered with a metallic shield plate.

15. The LD/PD module according to claim 3, wherein the receiving portion is covered with a metallic shield plate.

16. The LD/PD module according to claim 4, wherein the receiving portion is covered with a metallic shield plate.

17. The LD/PD module according to claim 1, wherein the PD is a bottom incidence type photodiode.

18. The LD/PD module according to claim 2, wherein the PD is a bottom incidence type photodiode.

19. The LD/PD module according to claim 3, wherein the PD is a bottom incidence type photodiode.

20. The LD/PD module according to claim 4, wherein the PD is a bottom incidence type photodiode.

21. The LD/PD module according to claim 1, wherein the PD is a front end incidence type photodiode.

22. The LD/PD module according to claim 2, wherein the PD is a front end incidence type photodiode.

23. The LD/PD module according to claim 3, wherein the PD is a front end incidence type photodiode.

24. The LD/PD module according to claim 4, wherein the PD is a front end incidence type photodiode.

* * * * *